United States Patent
Alho et al.

(10) Patent No.: US 7,765,240 B2
(45) Date of Patent: Jul. 27, 2010

(54) COMPUTER-AIDED MODELING

(75) Inventors: Pertti Alho, Helsinki (FI); Ragnar Wessman, Espoo (FI); Ville Rousu, Espoo (FI); Jukka Suomi, Espoo (FI); Jukka Partanen, Espoo (FI); Timo Rihtniemi, Helsinki (FI); Tiina Rautakorpi, Espoo (FI); Mika Salonen, Espoo (FI); Teemu Heikkonen, Helsinki (FI)

(73) Assignee: Tekla Corporation, Espoo (FI)

( * ) Notice: Subject to any disclaimer, the term of this patent is extended or adjusted under 35 U.S.C. 154(b) by 438 days.

(21) Appl. No.: 10/840,250

(22) Filed: May 7, 2004

(65) Prior Publication Data

US 2004/0267695 A1 Dec. 30, 2004

Related U.S. Application Data

(60) Provisional application No. 60/470,192, filed on May 14, 2003.

(30) Foreign Application Priority Data

May 7, 2003 (FI) .................................. 20030686

(51) Int. Cl.
*G06F 17/30* (2006.01)
(52) U.S. Cl. .................. 707/803; 707/805; 707/807
(58) Field of Classification Search ................. None
See application file for complete search history.

(56) References Cited

U.S. PATENT DOCUMENTS

| | | | |
|---|---|---|---|
| 4,912,657 A | 3/1990 | Saxton et al. | |
| 5,251,290 A | 10/1993 | Pabon | |
| 5,412,762 A | 5/1995 | Kondo | |
| 5,856,828 A | 1/1999 | Letcher, Jr. | |
| 5,859,786 A | 1/1999 | Klein | |
| 6,219,049 B1* | 4/2001 | Zuffante et al. | 715/764 |
| 6,289,345 B1* | 9/2001 | Yasue | 707/10 |
| 6,539,519 B1 | 3/2003 | Meeker | |
| 6,898,560 B1* | 5/2005 | Das | 703/7 |
| 2005/0209831 A1* | 9/2005 | Jungreis et al. | 703/1 |

OTHER PUBLICATIONS

Eggli et al., "Inferring 3D models from freehand sketches and constraints", Computer Aided Design, Elsevier Publishers, vol. 29, No. 2, Feb. 1997, pp. 101-112, XP-000691392.
Sohrt W. et al., "Interaction with Constraints in 3D Modeling", Proceedings, Symposium on Solid Modeling Foundations and CAD/CAM Applications, Jun. 5, 199, pp. 387-396, XP-002231158.
Nemetschek Allplan Version 12 Handbuch Architektur, Nemetschek Programmsystem GmbH, Nov. 1996, XP-002301600.
MCNP—A General Monte Carlo Code N-Particle Transport Code, Version 5 LA-UR-03-1987, Apr. 24, 2003.

* cited by examiner

*Primary Examiner*—Khanh B Pham
(74) *Attorney, Agent, or Firm*—Young & Thompson

(57) ABSTRACT

To minimize errors in computer-aided modeling, an object created by a user on the basis of a prototype must contain data about another object it can be linked with and about the linking. The object created by the user can be provide with these data by determining at least one logical property either for the object created by the user or for an object associated therewith; adding at least one logical definition to the object created by the user, the definition being based on at least one logical property of either the associated object or the created object; and forming a dependency by means of the logical definition.

20 Claims, 5 Drawing Sheets

COMPUTER-AIDED MODELING

FIELD OF THE INVENTION

The invention relates to computer-aided modeling and particularly to parametric modeling.

BACKGROUND OF THE INVENTION

Modeling means that an object is depicted with a model. The aim of modeling is to provide a model that functions in the same way as the object it represents in the real word. How well this aim is achieved naturally depends on the properties of the modeling tool employed.

As data processing systems and computers have improved, modeling has become a computerized process. Parametric modeling systems, for example, have been devised for modeling complicated objects, such as buildings, which may consist of large numbers of different parts. These systems typically apply predefined elements that are provided with values in connection with the modeling. Examples of these elements include different parts, such as beams, columns, plates, different connections, details and macros and dimension lines used in drawings. A connection is usually made between two or more parts. A detail usually relates to one part and one point. A macro is more common than these two and can be used for creating spiral stairs and railings thereof, for example. In parametric modeling a beam, for example, is modelled by defining its starting and ending points and different parameters representing its physical properties. It is thus possible to model a beam in such a way that the form and size of the beam are no longer fixedly associated with the beam. In other words, the modelled object is not tied to the physical properties of the part it depicts, but the geometry of the object can be created, when needed, by using different parameters. The parameters of a beam, for example, may include location, material, type of cross-section and size. Since form and size are not fixedly associated with the object, the profile of the beam, for example, can be changed and thus the profiles of all beams modelled by copying one and the same beam can be updated very rapidly.

A change made to an object in the modeling program should also update the environment of the object. For example, the changing of a beam should change the connections between the beam and other beams, or, in other words, a connection should change according to the beams it is connected to. The updating of connections has been resolved by defining and storing different connections in software libraries from which the program selects the correct connections for particular beams and/or columns on the basis of specific rules. In other words, a predefined connection is defined as a complete piece of software that knows how the connection is to be produced. This solution involves problems caused by the fact that each connection requires a separate piece of software and by the memory space required by the libraries and the manageability thereof: different countries apply different standards to connections used between beams, and companies may apply standards of their own. Moreover, there are dozens of parameters associated with a beam that have an impact on a connection to be made between two beams, or between a beam and a column, a footing, or a slab. The library contains corresponding connections defined for columns and slabs, for example.

When a model has been created with this system using elements, such as connections, defined in advance in the system, and the model is to be changed by changing the thickness of a beam, for example, the system updates the connections, for example, to correspond to the changed situation. In other words, the functioning (behaviour) of objects created using predefined elements is programmed into the system and the objects are capable of adjusting themselves to changing situations as needed. This means that they comprise "intelligence", i.e. they understand how connecting depends on the element to be connected and how a connection is produced depending on their parameters.

As indicated above, all alternatives that are possible and may be needed in modeling cannot be provided by predefined elements. It is therefore also possible that the user defines elements (known as compound elements) by using parts known as basic components in the modeling system. The user is not, however, capable of programming functioning or behaviour into an element he/she has defined. A problem with an object created using an element defined by the user is that the parameters and attributes of the object are associated with the physical properties specified for the element at the time of it was defined and the object does not take into account its environment or changes in the environment in any way. For example, although a connection defined by a user to the top of a column of a cross-sectional size of 300*300 can be copied to the top of a 400*400 column, the connection is not capable of updating its dimensions to correspond to the changed dimensions of the column. The user therefore has to define a new connection for a column top having a different cross-sectional surface. It takes more time to define a new connection than merely to copy one. Another alternative is that the user requests the system supplier to add the connection as a predefined connection to the software library and waits for the next system update. Correspondingly, if the column is reduced to a size 200*200, the outer dimensions of the connection remain unchanged, i.e. they are too big. In other words, objects created using elements defined by the user do not understand how a connection depends on the element to be connected and on the parameters of the object. This increases the risk of errors, and faulty elements may cause delay in construction works, for example, because when an object that is created by the user on the basis of a prototype changes, it must be kept in mind to manually update the connections and the parts to be connected according to the change and, correspondingly, changes made to the parts to be connected must be updated to the object concerned. For example, if the user has modelled a stiffener between the upper and lower flanges of a beam and then changes the height of the beam, the height of the stiffener does not change automatically. A corresponding problem appears in drawings generated on the basis of a model, because also the user can make dimension lines to drawings, the lines thus representing elements defined by the user. For example, the user may determine that a distance between two bolts is to be presented in the drawings. When the user then uses the model thus defined to make drawings and then moves one of the bolts, the dimension line is not updated to correspond to the new situation, although otherwise the model is correctly shown in the drawings, because the dimension line is fixedly associated with the physical position of the bolt in the drawings as it was at the time the dimension line was defined.

BRIEF DESCRIPTION OF THE INVENTION

It is therefore an objective of the invention to provide a method and equipment implementing the method that allow the above problem to be solved. The objective of the invention is achieved with a method, system and computer software product characterized by what is stated in the independent claims. The preferred embodiments of the invention are disclosed in the dependent claims.

The basic idea of the invention is that an object created by a user is provided with at least one logical definition based either on a logical property of the object itself and/or a logical property of another object. The user may create the object when modeling a greater entity or when processing drawings made on the basis of the model. The object may be provided with a logical definition either when it is being created or later, and the object may be created using predefined elements and/or elements defined by the user. When the model is changed, for example, the next time or when drawings are made after a change, the logical definitions are used for finding the objects affected by the change and for updating the model or the drawing to correspond to the change.

A logical definition refers to a dependency of an object from at least one logical property. A logical property refers either to a property of the object itself or to a logical property of another object associated but not necessarily in physical contact with the former. Examples of logical properties may include a logical plane, such as an upper plane, left side plane, etc., of another object, or a logical line, such as a creation line, a reference line, a line of intersection of surfaces, or a logical point, such as the midpoint of a screw head or a point of intersection of three planes. An intersection of logical planes formed by different objects may also form a logical property.

An advantage of the method and computer software product of the invention is that although something in an object, for example its profile or height, is changed, other elements of the object, for example its connections and dimensions, are kept consistent, irrespective of whether the object was created using predefined elements or elements defined by the user.

The invention also allows the number of predefined elements, such as different connections, to be reduced. With the invention, a new connection can be defined such that it can be copied to different places, for example to column tops of different cross-sectional sizes, without the user needing to modify the connection and without the connection having been programmed into the modeling system. As a result, less time needs to be spent on defining and the user obtains a new connection without having to wait for the next update of the modeling system. In addition, the user can take the connection in use even if it were a connection that is not going to be added to the connections library in connection with the update of the modeling system.

BRIEF DESCRIPTION OF THE DRAWINGS

In the following, the invention will be described in greater detail in connection with the preferred embodiments and with reference to the accompanying drawings, in which.

DETAILED DESCRIPTION OF THE INVENTION

The present invention can be applied in connection with any model-based modeling system, including those known as CAD-type systems, in which the modelled object consists of edges and the form and size of the object are essential elements of the modelled object. In CAD-type systems a beam, for example, is modelled by drawing each side of the beam and then combining the sides to form the beam, the profile of the beam being then modified by moving a necessary number of beam sides away from their original location. The invention is particularly suitable for modeling systems based on the same idea as the parametric modeling system described above in which the physical properties of an object are expressed as attributes, i.e. by using parameters.

In the following, the invention is described by means of an example representing a system in which software according to the invention is executed in a personal computer by applying a run-time virtual database comprising data to be stored in the computer's disc memory and those already stored there about the object entity to be modelled/already modelled, such as a building, the invention not being restricted thereto. According to another embodiment of the invention, it is possible to make use of an object-based database or a relational database, for example, which may be accessed via a network, from one or more terminals. Different programming techniques, storage of data in memories and methods of implementing databases are under continuous development. This may require additional changes to the invention, therefore all words and expressions used herein should be interpreted in their broadest sense and understood to illustrate and not to restrict the invention.

Figure 1:
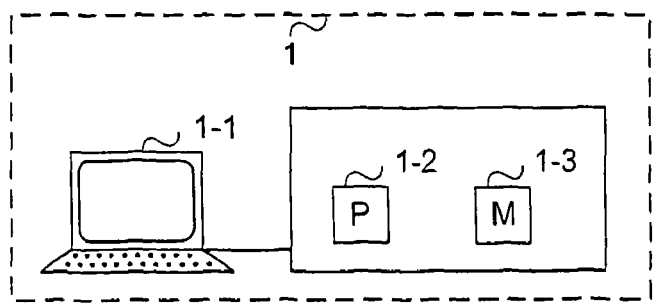
FIG. 1 is a simplified block diagram illustrating the architecture of a system used as an example.

FIG. 1 shows a simplified modeling system, illustrating only the most essential parts of the logical units of the system, the implementation of which may differ from the one given in this disclosure. A person skilled in the art will find it obvious that the system may also comprise other functions and structures which need not be described in greater detail in this context. A more detailed structure of the system is irrelevant to the invention described.

The modeling system 1 of FIG. 1 comprises a personal computer having a user interface 1-1, a processor 1-2, and memory 1-3.

The user interface 1-1 provides the user, i.e. the person processing the model, with an interface to the modeling system. Through the user interface the user can create, modify and view a model and use it for producing drawings, reports, etc., according to his/her choice. The method of entering data into the modeling system is not relevant to the invention. The methods described below are therefore only examples and do not restrict the invention in any way.

The processor 1-2 carries out functions of the invention according to the different embodiments thereof. The data to be stored in accordance with the invention in the memory 1-3 vary depending on the embodiment concerned and will be described later. In the system used as an example, the data are stored in a file, for example, and during processing they form what is known as a virtual database in a main memory into which they are read from a disk memory and where they can be more rapidly processed. When the processing is completed, the data in the virtual database, or at least the changed data, are stored in the disk memory. It is apparent to a person skilled in the art that the data can be stored in one or more files and/or that they can be stored/processed in another format and/or using other memory alternatives.

The modeling system shown in FIG. 1 represents the simplest form of the modeling system. In larger modeling systems the user interface may be a terminal and the memory may be a database to which the terminal is connected over a server. The server executes the operations of the processor of the system used as an example, or at least some of them, and the terminal may also execute some of the operations of the processor of the system used as an example. Between the terminal and the server there may be one or more networks. They may consist several terminals and servers provided with the associated databases, which are preferably integrated so that the user sees them as a single database and a single database server. The location where the system functions to be described below are carried out, i.e. whether the database data are processed at the terminal, at the database server, or partly at the terminal and partly at the database, is not relevant to the invention.

In the following, the invention will be discussed with reference to a system serving as an example and to one working example. For the sake of clarity, it is assumed that the system determines, for example deduces, whenever needed, the logical properties of an object, for example its logical planes, by deducing first the geometry of the object on the basis of its parameters and then applying predefined algorithms based on the geometry to deduce the logical properties. For the sake of clarity, it is further assumed that in the system used as an example, the logical properties of the beam consist of logical planes. The logical planes of the system are preferably deduced such that the simplest profiles have several overlapping planes, whereas complex profiles may have no overlapping planes at all. It is apparent to a person skilled in the art that other logical properties can also be determined, but here the planes provide a sufficient example to illustrate the basic idea of the invention. In another embodiment it may be possible to define logical planes for specific parts and anchor bolts and logical points for planes, such as slabs. A logical property may also consist of a side suitable for fastening a profile, for example. One of the flanges of an L-profile, for example, may be particularly suited for bolting and thus one logical property of an L-profile could be "L-profile flange suitable for bolting". How logical properties are determined is therefore not restricted in any way in the invention.

It is also possible to store logical properties of profiles and the basic elements to be used, for example, in the memory of the system. According to a preferred embodiment the logical properties of the most typical profiles and basic elements are stored in the memory, whereas those of other profiles and parts are determined as need arises. According to an embodiment of the invention the user can determine at least some of the logical properties by determining a horizontal plane traversing a mass center, for example, to represent a logical plane. Whether the logical properties of an object are determined according to need, whether they, or some of them, are determined in advance into the memory, or whether they are determined by the user is not relevant to the invention.

Figure 2A:
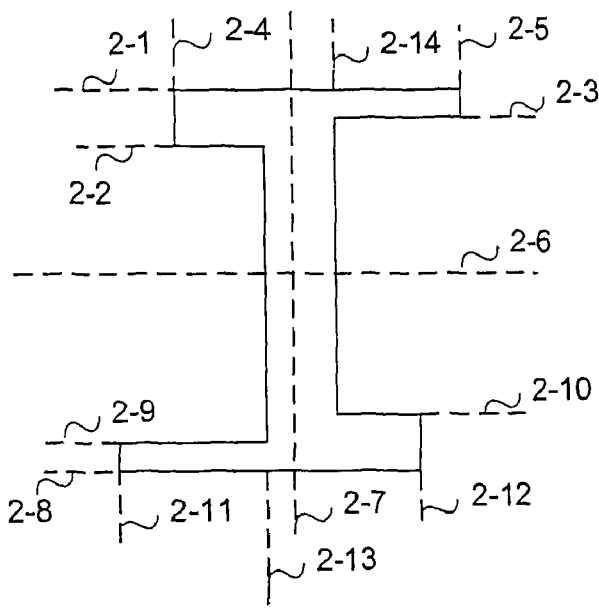
FIGS. 2A and 2B illustrate examples of logical properties.
Figure 2B:
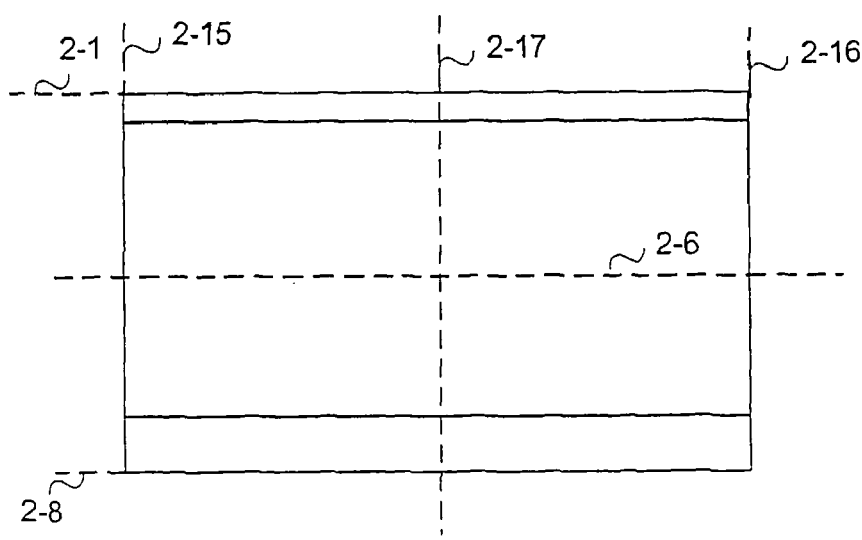

FIGS. 2A and 2B show 17 different logical properties, or logical planes, of an I-profile in the system used as an example. These are: upper flange top surface 2-1, upper flange left bottom 2-2, upper flange right bottom 2-3, upper flange left edge surface 2-4, upper flange right edge surface 2-5, horizontal central axis 2-6, vertical central axis 2-7, lower flange bottom 2-8, lower flange left top surface 2-9, lower flange right top surface 2-10, lower flange left edge surface 2-11, lower flange right edge surface 2-12, left web edge 2-13, right web edge 2-14, leading beam end 2-15, trailing beam end 2-16, and longitudinal central axis 2-17 of a beam. In a symmetrical I-beam some of the planes, such as the lower flange left edge surface 2-11 and the upper flange left edge surface 2-4 are overlapping. In the system used as an example, corresponding logical planes are deduced also for other profiles. For a rectangular beam, for example, the following corresponding logical planes can be unambiguously deduced: 2-1, 2-8, 2-13, 2-14, 2-6, 2-7, 2-15, 2-16, and 2-17.

Also outermost planes could be defined as logical planes, for example the highest or topmost plane (plane 2-1 in the example of FIG. 2), the lowest or bottommost plane (plane 2-8 in the example of FIG. 2), the leftmost plane (plane 2-11 in the example of FIG. 2), or the rightmost plane (plane 2-5 in the example of FIG. 2).

Left and right as referred to in connection with logical properties are preferably defined in advance on the basis of predefined rules such that they do not change when the direction of viewing changes. It is, after all, possible to view a three-dimensional model from a number of different directions and therefore left may become right when viewed from a different direction.

The system of the invention used as an example preferably includes rules, or sets of rules, of correspondence defined for the logical planes to allow planes matching with I-beam planes, for example, to be found in other profiles, for example in rectangular beams. This functionality is needed for example if an I-profile associated with a connection modelled by the user is replaced by a rectangular profile, for example, and the lower edge of an object connected to the I-profile has been provided with a logical definition "I-profile plane 2-10". The rules of correspondence may have been stored in the memory, or they may consist of rules of correspondence residing outside the system. When a profile is being changed, for example, it is also possible to ask the user what is to be done with a connected object. According to an embodiment, unambiguous correspondences are stored in the memory, or they are deduced by means of predefined algorithms, whereas the user is asked to provide correspondences that are ambiguous.

Logical properties can also be provided with hierarchy to indicate that there is a difference in rank among them. The hierarchy may be attached in the form of data, such as an indicator, about the level of hierarchy to which a particular logical property belongs. Hierarchy may be applied for example when selecting a logical property, for example to search for outermost planes first, then for planes that are next in hierarchy, etc., until a plane corresponding to a selection made by the user is found. In other words, hierarchy is used in an attempt to obtain general validity, whereby when the profile of a beam, for example, changes, the changed beam would contain the same plane as well. Hierarchy may also be useful in connection with rules of correspondence.

Figure 3A:
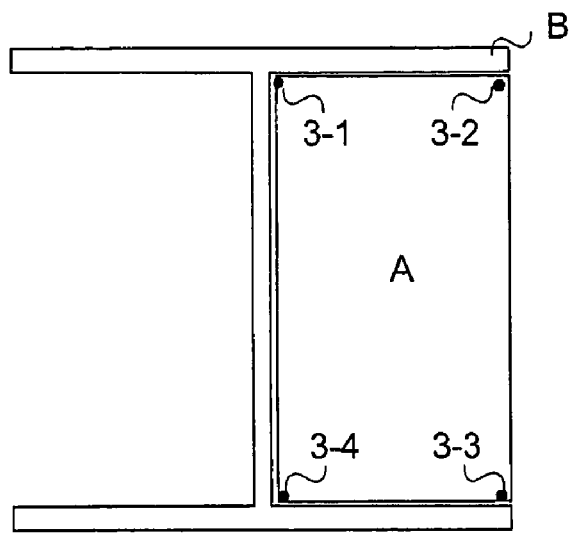
FIG. 3A is an end view of an object modelled by the user.
Figure 3B:
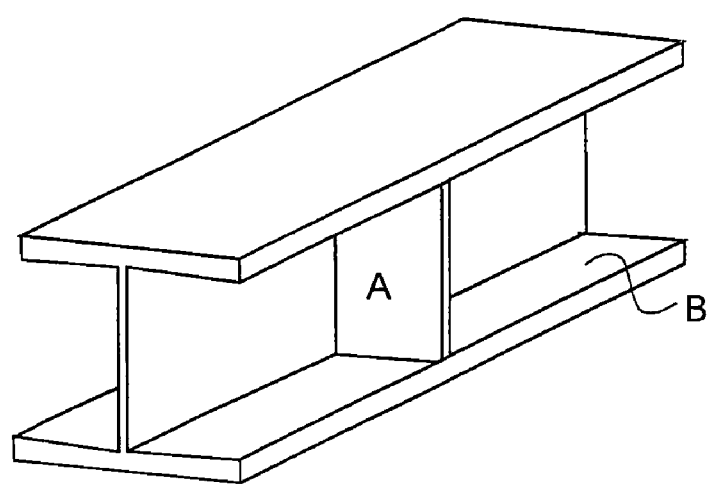
FIG. 3B is a perspective view of the object modelled by the user.
Figure 4:
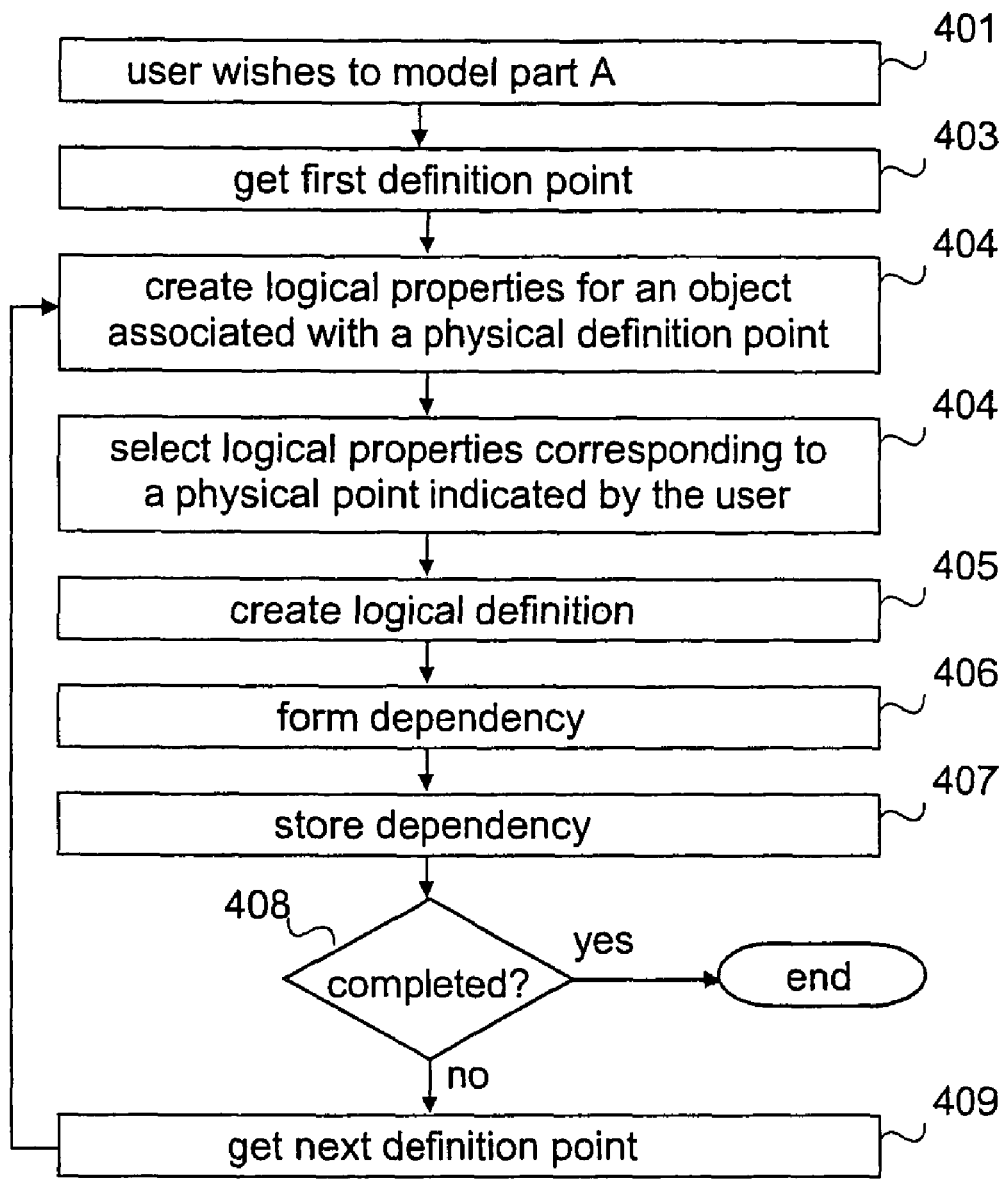
FIG. 4 is a flow diagram of how an object modelled by the user is provided with a logical definition.

It should be emphasized that the example described here is only meant to illustrate the invention and that the invention is not in any way restricted to it; on the contrary, logical definitions and eventual rules of correspondence may be created using various methods and rules. To illustrate the basic idea of the invention, FIGS. 3A, 3B and 4 provide an extremely simple example illustrating how a logical definition according to the invention is created for an object modelled by the user. The example does not describe the implementation of the structure in detail, such as the connections made between parts and the details associated therewith. FIGS. 3A, 3B and 4 illustrate a situation in which the user adds a stiffener A to an I-beam. For the sake of clarity, the specification relating to FIGS. 3A, 3B and 4 further assumes that the user can see the cross-section of the profile and is thus able to point the cursor correctly.

FIG. 3A shows a 2D view, or an end view, of an object displayed on a computer screen, whereas FIG. 3B shows a 3D model of the object. FIGS. 3A and 3B show the stiffener A and an I-beam B. The system refers to these parts, or objects, preferably with neutral terms, without associating them with a particular function or outer appearance. In our example the terms used are part A and part B. The names given to objects in the system are not relevant to the invention, provided that they are chosen so that any risk of confusion in names used in the same model is avoided.

In the example shown in FIGS. 3A and 3B, the user creates the stiffener A by providing the stiffener with the necessary parameters by pointing (with the mouse, for example) at corner points 3-1, 3-2, 3-3, and 3-4 (FIG. 3A) one after the other and by assigning different parameters to them. Examples of the stiffener parameters include thickness of the stiffener profile and the location of the definition point in relation to the corner points. The corner points become stiffener-defining positions 1, 2, 3, and 4. Next, the user places the stiffener midway the beam (by typing "at mid-length of the beam" on the keyboard, for example) (FIG. 3B). This position is also one of the stiffener-defining points and hereinafter referred to as 'distance'. When distance is combined with definition positions 1, 2, 3, and 4, three-dimensional definition points defining the stiffener and its location are obtained.

For the sake of clarity the defining of the points is described above using two-dimensional planes and definition points located in the plane in question, i.e. two-dimensional points, such that all points of the stiffener are at an equal distance, i.e. an equal location, in the longitudinal direction of the beam. A stiffener is, however, usually modelled directly to a three-dimensional view by pointing at the corner points in a three-dimensional manner. The points are thus modelled directly in 3D and they each have their specific location in a longitudinal direction, for example. To determine the location in the longitudinal direction, the modeling program can measure the physical distance of the point from a beam end, for example, the distance representing a logical property. Although in the above example the distance depends on a logical property of part B, the distance may be independent of B or it may depend on some other logical property of B. Similarly, although in the above example the stiffener is straight and perpendicular to the web of the I-beam, the stiffener may also be diagonal and/or at various angles to the web of the I-beam.

The corner points 3-1, 3-2, 3-3, and 3-4 shown in FIG. 3A, the distance shown in FIG. 3B, and the definition points corresponding to these may also be used as dimension points in mechanical engineering drawings or in construction site drawings. The dimension points of drawings and the operations according to the invention in relation to the dimensioning will be discussed in greater detail with reference to FIG. 6.

For the sake of clarity, in our example all the locations determined by the user coincide precisely with the points of intersection of the logical planes. However, the definitions made by the user are not in any way restricted to relate to a precise location on a logical plane, to points of intersection of logical planes, or to match precisely with a specific logical property. Instead, the user may determine that the location of stiffener A, for example, is at a distance of 500 mm from one end of the beam or the right-hand side top edge of the stiffener (FIG. 3A) to be at a distance of 50 mm to the left from corner point 3-2. In other words, the invention does not in any way restrict modeling but allows full freedom of design.

Hereinafter the example illustrated in FIGS. 3A and 3B will be referred to as the example of FIG. 3.

FIG. 4 is a flow diagram of the operation of the system of the invention described as an example and illustrates how the user models the example of FIG. 3. The flow diagram only shows a broad outline and not a detailed, step-by-step modeling of the example of FIG. 3. In the modeling according to the system of the invention used as an example, the user selects a physical point, plane, or some other physical element and the system searches for a logical correspondence with the user's choice.

In FIG. 4 the system has received in step 401 information indicating that the user wishes to model part A (stiffener A in FIG. 3) to part B. Part B may thus be called a part associated with part A. The system then searches for definition points of part A, one point at a time, in the order in which the user points at them. Depending on the embodiment, definition point may be a two-dimensional point or a three-dimensional point. An embodiment where definition points represented by planes are searched for as "definition points" is also possible. In step 402, the first definition point of stiffener A is provided by searching for a logical definition point corresponding to a physical position, i.e. corner point 3-1 in the example of FIG. 3. The system used as an example then determines, i.e. creates, in step 403 the logical properties of part B associated with the physical definition point selected by the user, i.e. in our example the logical planes determined for part B in FIGS. 2A and 2B. The system then selects in step 404 the logical properties corresponding to the physical position the user has pointed at. At least one logical property is selected in step 404. With reference to the examples of FIG. 3, the logical properties selected in connection with three-dimensional modeling are the right-hand side bottom of upper flange of part B, the right-hand side edge of the web, and the longitudinal central axis of part B, which in this example defines location. When the selection of a logical property/logical properties has been completed, the system creates in step 405 a logical definition on the basis of the selected logical properties, i.e. it provides part A with a logical definition. Next, in step 406, a dependency is formed between the logical definition point and the logical definition, the dependency being then stored in step 407 in the virtual database. The dependency corresponds to a relation used in relational databases. The routine then checks in step 408 whether the user has already completed the defining of the associated part by closing the data entry window or by pressing an interrupt key, for example. If the user has not finished yet, the next definition point is searched for in step 409 for the associated part, after which the routine proceeds to step 403 to create the logical properties of the part associated with the physical definition point shown by the user. The steps are repeated until the user stops the defining (step 408).

According to some embodiments of the invention, only logical properties of the highest hierarchy are determined, or created, first in step 403 and then in step 404 the routine checks whether they contain a logical property corresponding to the physical position. If they do, the property or properties in question are selected and the routine continues from step 405 by creating the logical definition/s. If no property is found, the routine returns to step 403 to determine the logical properties of the next lower level of the hierarchy, after which the routine returns to step 404 to check whether they contain a logical property corresponding to the physical position. Steps 403 and 404 are repeated until a logical property corresponding to the physical positions is found and/or the logical properties of even the lowest hierarchy level have been determined. If a logical property corresponding to the physical position cannot be found, even after the logical properties of the lowest hierarchy level have been determined, the logical property that comes closest in hierarchy can be selected and/or the user may be requested to submit additional parameters or the desired logical property.

According to an embodiment of the invention, the routine checks after step 408 whether logical properties have already been determined (i.e. created) for the associated part and if they have, the routine proceeds directly to step 404 to select the corresponding logical property. If no logical properties have been determined, the routine proceeds to step 403 to determine them.

According to an embodiment of the invention, a dependency/all dependencies are stored only when the user finishes the defining process, i.e. step 407 of FIG. 4 is executed after step 408.

In the embodiment used as an example, the following dependencies of the example of FIG. 3 are stored in the memory when the steps of FIG. 4 are being executed, the dependencies allowing both support A and sections of support A to be modelled in relation to both the beams:

| | |
|---|---|
| partA.definitionpoint1 = | partB.upper flange__right__bottom; |
| | PartB. web__right__edge |
| | partB.longitudinal__central axis |
| partA. definitionpoint 2 = | partB. upper flange__right__bottom; |
| | partB.upper flange__right__edge |
| | partB.longitudinal__central axis |
| partA. definitionpoint 3 = | partB. lower flange__right__top; |
| | partB. lower flange__right__edge |
| | partB.longitudinal__central axis |
| partA. definitionpoint 4 = | partB. lower flange__right__top; |
| | partB web__right__edge |
| | partB.longitudinal__central axis |

With these dependencies it is always possible to model part A even if one of part B's physical properties, for example its cross-sectional height or beam length, were changed.

In prior art solutions part A would have been determined directly by means of co-ordinates to a fixed position and with a fixed size, and it would have been made dependent on the physical properties of part B, instead of its logical properties. When logical properties can be applied in the defining as well, one and the same definition can be applied for different situations. Part A determined according to the invention is capable of modifying itself to be in line with an I-beam to which it is copied. In other words, if the web height of the I-beam of FIG. 3, for example, is 300 mm and its stiffener is copied to an I-beam having a web height of 400 mm, the logical definitions enable the stiffener to modify itself to be in line with the higher beam. Correspondingly, a connection, for example, can be associated with the top of beams located in a building storey, whereby when the connection is copied, it always associates itself with the top of the beams of the storey concerned and not with the top of the beams of the storey where it was defined. This allows the definitions to be copied, as distinct from the prior art, also to "non-identical" objects.

For the sake of clarity, the logical definition shown in the example is based on a plural number of separate logical dependencies, one of which is based on the logical definition of depth direction and the rest on 2-dimensional definitions in which a dependency comprises two logical definitions. However, a person skilled in the art will find it apparent that the invention can be implemented also in cases where one logical definition is based on one or more than two logical properties and/or one dependency contains only one or more than two logical definitions and/or a dependency is based on a 3-dimensional definition/definitions.

Figure 5:
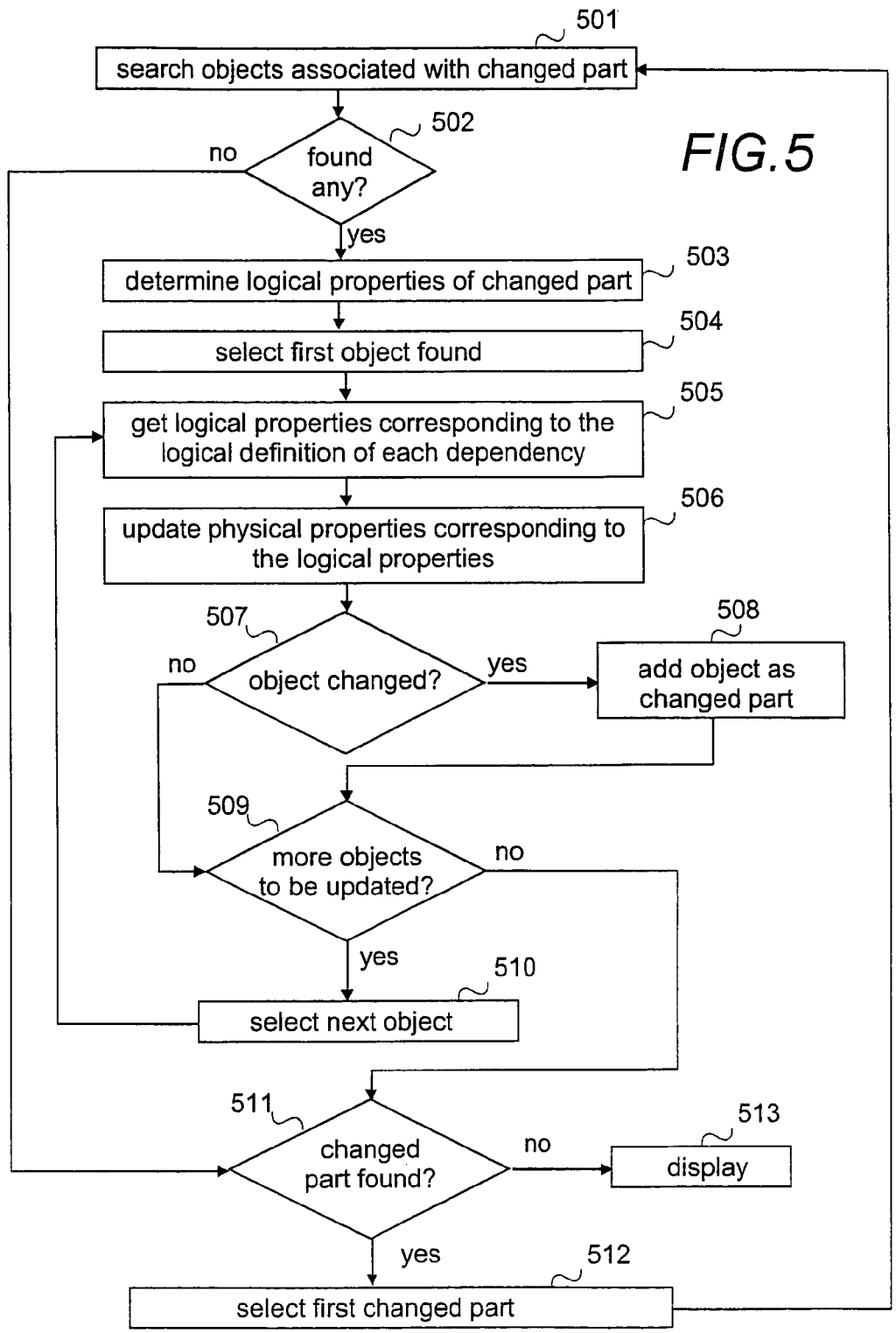
FIG. 5 illustrates the functioning of the system described as an example in a situation where the user changes a part of a previously created model.

FIG. 5 is a flow diagram illustrating the operation of the system used as an example in a situation where the user changes a part of the model, for example part B of the above example. FIG. 5 starts from a situation where the user has changed the part, for example by increasing the height of the web of part B (the I-beam of FIG. 3) used in the example. At this stage the run-time virtual database has already been set up. In response to the changing of the part, the system searches in step 501 the virtual database for all objects associated with the changed part. In other words, the system used as an example searches in the case illustrated as an example for dependencies in which part B appears on the right-hand side of the equation mark. In this example the system would find at least the dependencies shown in connection with FIG. 4. When the search has been completed, the system checks (step 502) whether such objects are found. If yes, then the system determines, i.e. creates in this example, the logical properties of the changed part in step 503 and selects in step 504 the first object found. The routine then searches in step 505 a logical property or features of the changed part which correspond/s to the logical defining of each dependency. When this has been completed, the routine updates in step 506 the physical properties of the object, for example its co-ordinates, corresponding to the logical properties of the object to be in line with the "current state" of the logical property of the changed part. In the system used as an example, updating means that the co-ordinates are at least counted, even when they have not changed. The routine then checks in step 507 whether the object changed as a result of the updating. If it did, the object is added in step 508 as a changed part, and then the routine proceeds to step 509 to check whether there are other objects that have not been updated. If there are, then the object found next is selected in step 510 and the routine proceeds to step 505 to search for a logical property or properties of a changed part that correspond/s to the logical definition of each dependency of the object.

If the object has not changed (step 507), the routine proceeds directly to step 509 to check whether there are still objects that have not been updated.

If all objects have been updated (step 509), the routine checks in step 511 whether there are changed parts that have not been checked. In other words, the routine checks, for example, whether any updated objects have been added in step 508 as a changed part. If there are changed parts that have not been checked, the routine selects in step 512 the first changed part that has not been checked and proceeds to step 501 to search for all objects associated with the changed part.

When all changed parts have been checked (step 511), the parts are shown on the display (step 513) using the updated data.

If no objects associated with the changed part were found (step 502), the routine proceeds to step 513 to check whether there are changed parts that have not been checked.

A similar updating process would be carried out if the user were to change the profile of part B from I-beam to C-beam or the thickness or position of part A.

In an embodiment of the invention, the object is always displayed immediately after the updating, before the next object is searched for. In other words, after step 506 of FIG. 5, step 513 is executed before step 507. According to a preferred embodiment of the invention, the updating is carried out one dependency at a time.

According to a preferred embodiment of the invention, only those dependencies are searched for (step 505) whose definitions are based on logical properties affected by the change.

According to a preferred embodiment of the invention, only the logical properties (logical property) of a changed part affected by the change are (is) defined (step 503).

According to a preferred embodiment of the invention, the routine does not check whether the updating changed the object, but the object is always added as a changed part.

Dimensions and dimension points represent elements. In the system used as an example, drawings are first created on the basis of a model and stored in the form of a drawing file in the memory by means of the virtual database. When creating a drawing, the user may at the same time create the dimensions or some of the dimensions that are to be shown in the drawings or in an individual drawing. For example, if the user wants to have a manufacturing drawing of part A shown in FIG. 3 to be used at an engineering workshop, the user may indicate that the width and height of stiffener A, i.e. the distance between corner points 3-1 and 3-4 and between corner points 3-4 and 3-3 of FIG. 3, are to be shown in the drawing. If the user also wishes to provide a dimension from point 3-1 to the mid-point of part A, he points at the corner point and at the mid-point of part A.

Figure 6:
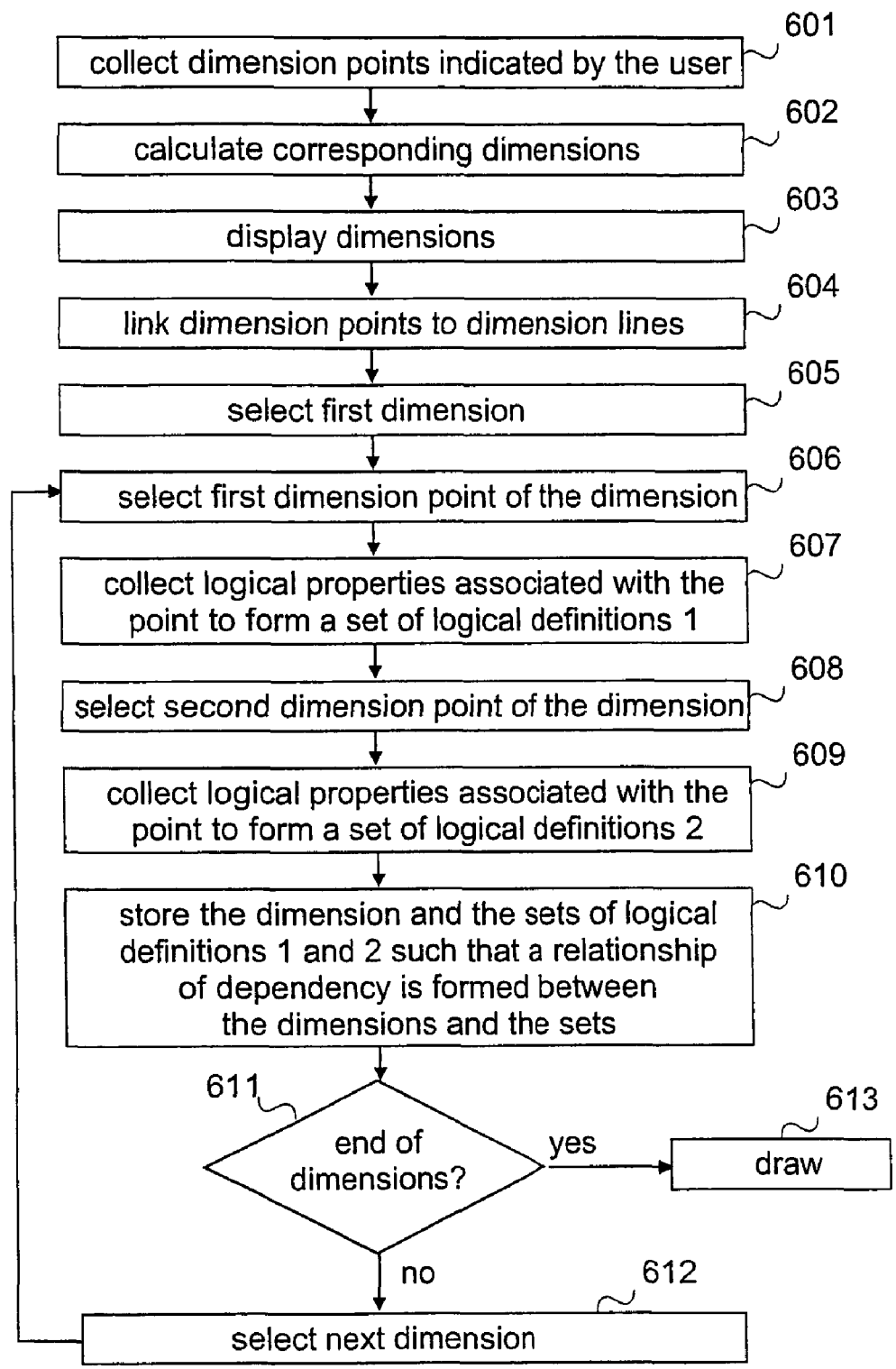
FIG. 6 illustrates the operation of the system of the invention used as an example in a case where a drawing is provided with dimensions determined by the user.

FIG. 6 illustrates the operation according to the invention in a situation where the dimensions in the system used as an example are created by the user. A similar operation is carried out when one or more dimensions are to be added and/or changed. The changing of a dimension may also consist of changing its dimension point. For the sake of clarity, FIG. 6 only shows the step in which the data are in the virtual database, the storage of the dimensions in the memory of the computer or their retrieval from the memory not being separately shown.

FIG. 6 assumes that the user wishes to add several dimensions to a particular drawing. The operating principle of the system used as an example, however, remains the same irrespective of whether the user adds only one dimension or only a dimension point. The dimensions are typically shown on a 2-dimensional plane. In our example the system collects in step 601 the dimension points indicated by the user, calculates in step 602 the corresponding dimensions, displays in step 603 the dimensions on a display visible to the user, links in step 604 the dimension points to dimension lines, and starts entering the dimensions into the virtual database.

When entering the dimensions into the virtual database, the system collects dimension data associated with each dimension and adds also these data to the virtual database. In our example the dimension data refers to data defining a dimension point. The dimension data preferably contain all logical definitions associated or to be associated with the points, the definitions being based on logical properties. The dimension data associated with a point can be collected by applying a dimension point line, which is an imaginary line running through a dimension point and perpendicular to the view shown to the user. The user therefore sees it as a point. One of the rules for collecting dimension data states that a plane may be a definition plane if the dimension point is on the plane or the dimension point line intersects a plane. A line of intersection of two planes may constitute a definition line if the dimension point is on the line of intersection or traverses the line of intersection of the planes. Three planes define a dimension point if the dimension point line traverses the point of intersection of the planes. Two lines of intersection, or a plane and a line of intersection define a dimension point if the dimension point line traverses the intersection between the lines of intersection or between the line of intersection and the plane. However, for the sake of clarity, FIG. 6 only describes the collecting of logical definitions.

The adding of dimensioning data to the virtual database starts in step 605 with the selecting of the first dimension to be added. In step 606 a first dimension point of the dimension to be added is selected and then in step 607 logical properties associated with the dimension point are collected to provide a set of logical definitions 1 of the dimension. The logical properties of an object associated with the dimension point are searched for as disclosed in connection with FIG. 4, for example. Next, in step 608, a second dimension point of the dimension is selected and in step 609 logical properties associated with the second dimension point are collected to provide a set of logical definitions 2 of the dimension. Then in step 610 the dimension, its set of logical definitions 1 and logical definitions 2 are stored in the virtual database such that a dependency is created between the dimension and the definition sets. When the dimension has been stored in the virtual database, the routine checks in step 611 whether the dimension was the last one or whether there are still dimensions to be added. If there are, the next dimension is selected in step 612 and the routine moves to step 606 to select the first dimension point of that dimension.

When all the dimensions have been added to the virtual database (the reply received in step 611 is 'no'), the system draws the desired dimension or dimensions in step 613.

For example, the system described as an example adds the above dimensions according to their dimension points to the virtual database for part A of FIG. 3 such that a definition set of an initial point and an end point, together with the associated subsets, are added for each dimension. The definition set of point 3-1 comprises four different subsets: a first subset comprises the right-hand side under surface plane of upper flange of part B and the right-hand side edge plane of the web of part B, point 3-1 being their point of intersection in a two-dimensional drawing. A second subset of the definition set of point 3-1 comprises the upper plane of part A and the left-hand side edge plane of part A. A third subset of the definition set of point 3-1 comprises the upper plane of part A and the right-hand side edge plane of the web of part B. A fourth subset of the definition set of point 3-1 comprises the right-hand side bottom plane of the upper flange of part B and the left-hand side edge plane of part A. A first subset of the definition set of point 3-3 comprises the right-hand side edge plane of the lower flange of part B and the right-hand side top plane of the lower flange of part B. A second subset of the definition set of point 3-3 comprises the right-hand side edge plane of the lower flange of part B and the bottom plane of part A. A third definition set of point 3-3 comprises the under plane of part A and the right-hand side edge plane of part A. A fourth subset of the definition set of point 3-3 comprises the right-hand side top plane of the lower flange of part B and the right-hand side edge plane of part A. Correspondingly, a first subset of the definition set of point 3-4 comprises the right-hand side top plane of the lower flange of part B and the right-hand side edge plane of the web of part B. A second subset of the definition set of point 3-4 comprises the under plane of part A and the left-hand side edge plane of part A. A third subset of the definition set of point 3-4 comprises the under plane of part A and the right-hand side edge plane of the web of part B. A fourth subset of the definition set of point 3-4 comprises the right-hand side top plane of the lower flange of part B and the left-hand side edge plane of part A. The definition set of the mid-point of part A comprises only one subset, which in turn comprises the horizontal central axis of part A and its vertical central axis.

According to an embodiment of the invention, it is possible to store only one definition set for a dimension point. In other words, for point 3-1, for example, only one of its subsets may be stored.

According to an embodiment of the invention, the dimension points are determined first, and each dimension is then provided with data about its dimension points.

Next time the drawings are opened, modified and/or printed in the system used as an example, it is checked whether the model has been changed after the previous storage of the drawings. If it has, the system searches the virtual database for definition sets associated with a dimension of the drawings to be printed, updates the dimension/dimensions together with their dimension points on the basis of the logical properties of the definition sets and other dimension data to the virtual database and prints out the drawings with the updated dimensions. The updating is carried out by applying the principles disclosed in connection with FIG. 5 for defining dimension point location and for calculating dimensions.

Although the above dimensions and dimension points are directly defined by the user, properties and/or type definitions provided by the system or submitted by the user can be added to the dimensions and/or dimension points. These enable to define a dimension modelled by the user between two screws, for example, as a combined dimension, whereby the adding of a screw to the connection concerned causes the system to add the corresponding dimension between the new screw and a previous one.

The steps shown in FIGS. 4, 5 and 6 are not in an absolutely chronological order, and they may be executed in a different order than given here, or simultaneously. Other functions may be carried out between the described steps or simultaneously with them. It is also possible to leave out some of the steps shown in the Figures or to replace some of the described steps by a step that produces a corresponding end result. For example, step 403 of FIG. 4 can be replaced by a step in which the logical properties of an associated part are determined by retrieving and not by creating them.

Although the invention is described above with reference to examples in which an object depends on another object, i.e. an object has been provided with a logical definition made on the basis of a logical property of the other object, it is apparent to a person skilled in the art how the logical definition of an object may depend on a logical property of the object itself. For example, the top of the left lower flange of an I-beam can be determined to be on the same level as the top of the right lower flange, or on a level which is 2 cm above the bottom of the right-hand side lower flange.

It is also apparent to a person skilled in the art that logical definitions may depend on both a logical property of some other object and a logical property of the object to be created.

A person skilled in the art will also find it apparent that a logical property of an object may be determined on the basis of a logical property of another object. For example, the outermost edge of a stiffener may be defined on the basis of the outermost edge of a beam.

Further still, a physical property, such as the physical structure of an object, may depend on a logical property of the object and/or a logical property of another object.

The above described different embodiments of the invention and/or the different operations of the system used as an example can also be combined differently than disclosed above to produce new embodiments of the invention.

A modeling system implementing the functionality according to the present invention comprises, in addition to means needed in prior art modeling, means for producing, storing and/or applying logical definitions. More specifically, it comprises means for implementing at least one of the above embodiments. Current personal computers or terminals and database servers comprise processors and memory that can be applied in functions according to the invention. All changes and configurations needed for implementing the invention can be executed as added or updated software routines, using application-specific integrated circuits (ASIC) and/or by otherwise configuring an existing system, particularly a modeling system. Software/software routine(s) can be stored in any computer-readable data storage medium.

It is apparent to a person skilled in the art that as technology advances the basic idea of the invention can be implemented in various ways. The invention and its embodiments are therefore not restricted to the above examples, but they may vary within the scope of the claims.

The invention claimed is:

1. A method comprising:
displaying on a computer screen at least a first object, the first object representing a real world article in a model, the first object's geometry being defined by the first object's parameters, the parameters representing physical properties of the first object, the parameters representing the physical properties comprising length and height;
receiving, via a user interface, a user input indicating that a second object representing another real world article is to be modeled to the model comprising the first object so that the second object is associated with the first object;
receiving, via the user interface, a user input defining at least a definition point for the second object, the definition point being associated with the first object and defining a physical property for the second object through logical correspondence with the first object;
determining at least one logical property for the first object that is in correspondence with the definition point of the second object by executing an algorithm in a computer, the determined at least one logical property being one of plural determinable logical properties of the first object, the determined logical property i) being based on the geometry of the first object, ii) corresponding to the definition point of the second object, iii) being free of any parameter representing the physical properties of the first object, iii) not independently defining the geometry of the first object, iv) and remaining foundable by the computer from another geometry according to a rule of correspondence after a change in the geometry of the first object;
selecting at least one logical property from amongst the determined logical properties of the first object, the selected at least one logical property corresponding to the definition point;
creating, by using the selected at least one logical property, at least one logical definition to the second object, the at least one logical definition defining how the second object depends on the selected at least one logical property of the first object;
forming a dependency by between the created logical definition to the second object and the definition point;
storing the dependency as a parameter of the second object; and
using the dependency to model the second object.

2. A method according to claim 1, further comprising:
determining at least one logical property for the second object;
creating at least one further logical definition defining how the second object depends on the at least one logical property of the second object;
storing the at least one further logical property as a further parameter of the second object;
forming another dependency between i) the created logical definition and the created further logical definition to ii) the second object and the definition point.

3. A method according to claim 2, wherein
the step of determining the at least one logical property for the second object is performed by receiving, via the user interface, a user input determining a logical property of the second object in connection with the modeling of the second object,
the logical property of the second object being one of a logical plane, a logical line, and a logical point, the logical property being free of any parameter representing the physical property of length.

4. A method according to claim 1, wherein,
the parameters defining the first object's geometry comprise a first cross-section type of the first object, the determined logical property remains foundable by the computer upon the geometry of the first object changing from being based on the first cross-section type to a second cross-section type using the rule of correspondence after the change in the geometry of the first object, and the at least one logical property of the first object is one of a logical plane, a logical line, and a logical point.

5. A method according to claim 4, wherein, the first cross-section type of the first object is one of an "I" cross-section and an "L" cross-section, and the second cross-section of the first object is another of the "I" cross-section and the "L" cross-section, the determined logical property of the first object remains foundable by the computer, using the rule of correspondence after the change in the geometry of the first object, upon the geometry of the first object changing from i) being based on the "I" cross-section and changing to being based on the "L" cross-section, and ii) being based on the "L" cross-section and changing to being based on the "I" cross-section.

6. A method according to claim 1, further comprising:

changing at least one part of the model of the real world article represented by the first object;

searching for objects associated with the changed part;

when at least one object is found:

determining at least one logical property of the changed part;

searching for a logical property of the part that corresponds to the logical definition of the dependency of the object; and updating a physical property of the object that corresponds to the logical property.

7. A method according to claim 6, further comprising:

applying the hierarchy when determining a logical property.

8. A method according to claim 1, wherein hierarchy is added to a logical property.

9. A method according to claim 1, further comprising:

adding hierarchy to the logical property; and applying the hierarchy in connection with the rule of correspondence.

10. A method comprising:

displaying on a computer screen at least an object, the object representing a real world article in a model, and a geometry of the object being defined by parameters representing physical properties of the first object, the parameters representing the physical properties comprising length and height;

receiving, via a user interface, a user input indicating that a dimension is to be added to the object;

determining at least one logical property for the first object by executing an algorithm in a computer, the determined logical property being based on the geometry of the object and being free of any parameter representing physical properties of the object and not defining the geometry of the object and remaining foundable by the computer from a change in geometry of the object according to a rule of correspondence if the geometry of the object changes;

receiving, via the user interface, a user input defining at least a first dimension point for the dimension;

collecting, by the computer, logical properties associated with the first dimension point amongst the determined logical properties to provide a first set of logical definitions;

receiving, via the user interface, a second dimension point for the dimension;

collecting, by the computer, logical properties associated with the second dimension point amongst the determined logical properties to provide a second set of logical definitions;

storing, by the computer, the dimension and the first and second set of logical definitions such that a dependency is created between the dimension and the first and second set of logical definitions; and using, by the computer, the dependency to add the dimension to a drawing.

11. A method according to claim 10, wherein the determining at least one logical property, collecting logical properties associated with the first and second dimension points, and storing the dimension and the first and second set of logical definitions such the dependency is created, are executed by the computer in response to storing of the drawing.

12. A method according to claim 10, further comprising:

changing at least one part of the model;

searching, by the computer, in response to a change in at least one part of the model, for objects associated with the changed part;

when at least one object is found:

determining at least one logical property of the changed part;

searching for a logical property of the part that corresponds to the logical definition of the dependency of the object; and updating a dimension of the object that corresponds to the logical property.

13. A method according to claim 10, wherein hierarchy is added to a logical property.

14. A method according to claim 13, further comprising the step of applying the hierarchy when determining a logical property.

15. A method according to claim 10, further comprising the steps of:

adding hierarchy to the logical property; and applying the hierarchy in connection with the rule of correspondence.

16. A computer system for computer aided modeling, the computer system comprising:

a database storing a model that comprises at least a first object, the first object representing a real world article in the model, and a geometry of the first object being defined by the first object's parameters, the parameters representing physical properties of the first object, the parameters representing the physical properties comprising length and height;

a computer comprising at least one processor and at least one memory including computer program code, the at least one memory and the computer program code configured to, with the at least one processor, cause the computer at least to:

display at least the first object;

determine at least one logical property for the first object in response to receiving a user input defining at least a definition point for a second object representing another real word article that is to be modeled, the definition point being associated with the first object and defining a physical property for the second object, the logical property being based on the geometry of the first object and being free from any parameter representing the physical properties of the first object, not defining the geometry of the first object, and remaining foundable by the computer from another geometry according to a rule of correspondence upon a change in the geometry of the first object;
select at least one logical property amongst the determined logical properties of the first object, the selected logical properties corresponding to the definition point;
create, by using the at least one logical property, at least one logical definition to the second object, the at least one logical definition defining how the second object depends on the selected at least one logical property of the first object;
form a dependency by means of the logical definition and the definition point; and
store the dependency to the database as a parameter of the second object.

17. A computer system according to claim 16,
wherein the at least one memory and the computer program code are further configured to, with the at least one processor, cause the computer further to:
change a physical point received in the user input into a logical point of the first object and to form a dependency by using the logical point; and
display the second object by using the physical point corresponding to the logical point.

18. A computer system for computer aided modeling, the computer system comprising:
a database storing a model that comprises at least an object, the object representing a real world article in the model, a geometry of the object being defined by the object's parameters, the parameters representing physical properties of the object, the parameters representing the physical properties comprising length and height;
a computer comprising at least one processor and at least one memory including computer program code, the at least one memory and the computer program code configured to, with the at least one processor, cause the computer at least to:
display on a computer screen at least the object;
determine, in response to receiving a user input indicating that a dimension is to be added to the object, at least one logical property for the object, the logical property being based on the geometry of the object and being free of any parameter representing the physical properties, not defining the geometry of the object, and remaining foundable from another geometry according to a rule of correspondence upon the geometry of the object changing;
collect, in response to receiving a user input defining at least a first dimension point for the dimension, logical properties associated with the first dimension point amongst the determined logical properties to provide a first set of logical definitions;
collect, in response to receiving a user input defining at least a second dimension point for the dimension, logical properties associated with the second dimension point amongst the determined logical properties to provide a second set of logical definitions;
store the dimension and the first and second set of logical definitions such that a dependency is created between the dimension and the first and second set of logical definitions; and
use the dependency to add the dimension to a drawing.

19. A computer software product comprising a computer-readable program stored in a program storage medium, wherein the execution of the software in the computer causes the computer to carry out following method:
displaying at least a first object of a model, the first object representing a real world article in the model, wherein a geometry of the first object is defined by the first object's parameters, the parameters representing physical properties of the first object, the parameters representing the physical properties comprising length and height;
determining at least one logical property for the first object in response to receiving a user input defining at least a definition point for a second object representing another real word article that is to be modeled, the definition point being associated with the first object and defining a physical property for the second object,
the logical property being i) based on the geometry of the first object, ii) being free of any parameter representing the physical properties of the first object, iii) not defining the geometry of the first object, and iv) remaining foundable by the computer from another geometry according to a rule of correspondence upon the geometry of the first object changing;
selecting at least one logical property amongst the determined logical properties of the first object, the selected logical properties corresponding to the definition point;
creating, by using the at least one logical property, at least one logical definition to the second object, the at least one logical definition defining how the second object depends on the selected at least one logical property of the first object;
forming a dependency by means of the logical definition and the definition point; and
storing the dependency to the database as a parameter of the second object.

20. A computer software product comprising a computer readable program stored in a program storage medium, wherein the execution of the software in the computer causes the computer to carry out following method:
displaying at least an object of a model, the object representing a real world article in the model, wherein a geometry of the object is defined by the object's parameters, the parameters representing physical properties of the first object, the parameters representing the physical properties comprising length and height;
determining, in response to receiving a user input indicating that a dimension is to be added to the object, at least one logical property for the object,
the logical property i) being based on the geometry of the object, ii) ii) being free of any parameter representing the physical properties of the first object, iii) not defining the geometry of the object, and iv) remaining foundable from another geometry according to a rule of correspondence upon the geometry of the object changing;
collecting, in response to receiving a user input defining at least a first dimension point for the dimension, logical properties associated with the first dimension point amongst the determined logical properties to provide a first set of logical definitions;
collecting, in response to receiving a user input defining at least a second dimension point for the dimension, logical properties associated with the second dimension point amongst the determined logical properties to provide a second set of logical definitions;
storing the dimension and the first and second set of logical definitions such that a dependency is created between the dimension and the first and second set of logical definitions; and
using the dependency to add the dimension to a drawing.

* * * * *